United States Patent
Min et al.

(10) Patent No.: US 7,072,208 B2
(45) Date of Patent: Jul. 4, 2006

(54) VORTEX MAGNETIC RANDOM ACCESS MEMORY

(75) Inventors: Tai Min, San Jose, CA (US); Yimin Guo, San Jose, CA (US); Pokang Wang, San Jose, CA (US)

(73) Assignee: Headway Technologies, Inc., Milpitas, CA (US)

( * ) Notice: Subject to any disclaimer, the term of this patent is extended or adjusted under 35 U.S.C. 154(b) by 124 days.

(21) Appl. No.: 10/900,943

(22) Filed: Jul. 28, 2004

(65) Prior Publication Data

US 2006/0023492 A1    Feb. 2, 2006

(51) Int. Cl.
*G11C 11/14* (2006.01)
(52) U.S. Cl. .................. 365/171; 365/158; 365/173
(58) Field of Classification Search ............. 365/171, 365/158, 173
See application file for complete search history.

(56) References Cited

U.S. PATENT DOCUMENTS

| | | | |
|---|---|---|---|
| 5,650,958 A | 7/1997 | Gallagher et al. | 365/173 |
| 6,072,718 A * | 6/2000 | Abraham et al. | 365/173 |
| 6,211,090 B1 | 4/2001 | Durlam et al. | 438/692 |
| 6,266,289 B1 | 7/2001 | Dubovik et al. | 365/213 |
| 6,269,018 B1 | 7/2001 | Monsma et al. | 365/145 |
| 6,654,278 B1 | 11/2003 | Engel et al. | 365/158 |
| 6,963,500 B1 * | 11/2005 | Tsang | 365/171 |
| 2003/0107849 A1 | 6/2003 | Ikarashi | 360/324.1 |

FOREIGN PATENT DOCUMENTS

WO    WO03/032336 A1    4/2003

OTHER PUBLICATIONS

"A 0.18 μm Logic-based MRAM Technology for High Performance Nonvolatile Memory Applications", by A. R. Sitaram et al., MRAM Development Alliance, IBM/Infineon Tech., IBM Semiconductor Research & Dev. Ctr., Hopewell Jctn, N.Y., USA.

* cited by examiner

*Primary Examiner*—Tuan T. Nguyen
*Assistant Examiner*—Pho M. Luu
(74) *Attorney, Agent, or Firm*—Saile Ackerman LLC; Stephen B. Ackerman

(57) ABSTRACT

An MTJ including the free layer and reference layer have a vortex magnetization state that is formed with a clockwise or counterclockwise rotation. The MTJ has a low aspect ratio elliptical shape and the magnetic layers have a dopant that is one of C, N, B, Zr, Ta, Pt, Nb, or Hf to facilitate the flux closure configuration. The vortex magnetization is induced by applying a reverse magnetic field in a direction opposite to the remnant magnetization in a magnetic layer. An anti-ferromagnetic layer is set in an AFM phase after the vortex state is induced in the adjacent reference layer. Switching the vortex state in the free layer involves applying a first field in a first direction to break the vortex and then applying a smaller second field in a reverse direction to a critical point where a vortex of opposite spin is induced.

54 Claims, 8 Drawing Sheets

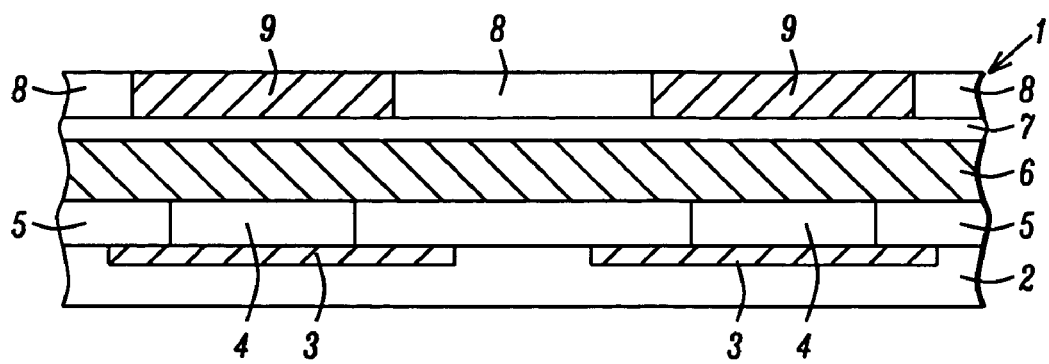
FIG. 1 – Prior Art
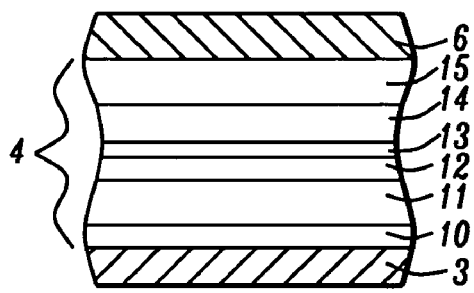
FIG. 2 – Prior Art
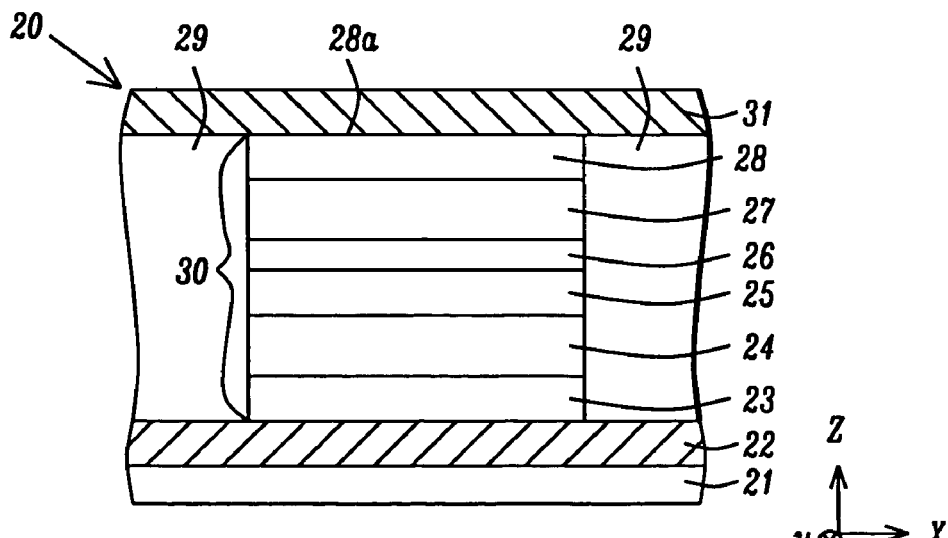
FIG. 3

US 7,072,208 B2

VORTEX MAGNETIC RANDOM ACCESS MEMORY

FIELD OF THE INVENTION

The invention relates to an MRAM cell structure, and more particularly, to a magnetic tunnel junction (MTJ) that has a low aspect ratio elliptical shape in which a free layer and reference layer have a vortex state of magnetization. The resulting flux closure configuration allows a smaller MRAM cell for dense arrays.

BACKGROUND OF THE INVENTION

Magnetic random access memory (MRAM) that incorporates an MTJ as a memory storage device is a strong candidate to provide a high density, fast (1–30 ns read/write speed), and non-volatile solution for future memory applications. An MRAM array is generally comprised of an array of parallel first conductive lines on a horizontal plane, an array of parallel second conductive lines on a second horizontal plane spaced above and formed in a direction perpendicular to the first conductive lines, and an MTJ interposed between a first conductive line and a second conductive line at each crossover point. A first conductive line may be a word line while a second conductive line is a bit line or vice versa. Alternatively, the first conductive line may be a sectioned line which is a bottom electrode. There are typically other devices including transistors and diodes below the array of first conductive lines.

The MTJ consists of a stack of layers with a configuration in which two ferromagnetic layers are separated by a thin nonmagnetic insulating layer such as $Al_2O_3$ or $AlN_xO_y$, which is called a tunnel barrier layer. One of the ferromagnetic layers is a pinned layer in which the magnetization (magnetic moment) direction is more or less uniform along a preset direction and is fixed by exchange coupling with an adjacent anti-ferromagnetic (AFM) pinning layer. The second ferromagnetic layer is a free layer in which the magnetization direction can be changed by external magnetic fields. The magnetization direction of the free layer may change in response to external magnetic fields which can be generated by passing currents through the conductive lines. When the magnetization direction of the free layer is parallel to that of the pinned layer, there is a lower resistance for tunneling current across the insulating layer (tunnel barrier) than when the magnetization directions of the free and pinned layers are anti-parallel. The MTJ stores information as a result of having one of two different magnetic states.

In a read operation, the information is read by sensing the magnetic state (resistance level) of the MTJ through a sensing current flowing through the MTJ, typically in a current perpendicular to plane (CPP) configuration. During a write operation, the information is written to the MTJ by changing the magnetic state to an appropriate one by generating external magnetic fields as a result of applying bit line and word line currents. Cells which are selectively written to are subject to magnetic fields from both a bit line and word line while adjacent cells (half-selected cells) are only exposed to a bit line or a word line field. Due to variations in MTJ size and shape that affect the switching field of a free layer, a magnetic state in a half-selected cell may be undesirably altered when writing to a selected cell.

To preserve data (magnetic state) against erasure, an in-plane magnetic anisotropy has to be strong enough in the storing magnetic layer. Current designs are based on shape anisotropy involving rectangular, ellipse, eye, and diamond-like patterns. A problem with these designs is that coercivity is highly dependent on shape, aspect ratio, and MTJ cell size and is therefore very sensitive to cell shape and edge shape which are subject to variations because of cell patterning processes. As a result, MTJ cell differences make the switching field highly variable and difficult to control.

To compete against current DRAM, SRAM, and Flash technologies, MRAM cell size must be in sub-micron dimensions. However, for sub-micron cell sizes, thermal agitation can switch the cell magnetization randomly, especially for half-selected cells. To prevent thermal agitation of half-selected cells, greater magnetic anisotropy is required which in turn demands a very high write current that renders MRAM non-competitive against other existing technologies because of high current and power consumption. Therefore, an alternate means of providing higher magnetic anisotropy is needed to make MRAM useful for high density and high speed applications.

Referring to FIG. 1, a conventional MRAM array 1 comprised of two adjacent MRAM cells with two MTJs 4 is depicted. There is a substrate 2 with a first conductive layer that in this example includes bottom electrodes 3 formed therein. Each bottom electrode 3 contacts an overlying MTJ 4 which is enclosed on the sides by an insulation layer 5. In this example, there is a bit line 6 in a second conductive layer that contacts the top of the MTJs 4. Typically, a second insulation layer 7 is deposited on the second conductive layer including bit line 6 and is subsequently planarized with a chemical mechanical polish (CMP) process. A third conductive layer 9 which may be an array of word lines is formed within a third insulation layer 8 on the second insulation layer 7. There are other circuits (not shown) that are used to select certain MTJs for read or write operations.

Referring to FIG. 2, a typical MTJ 4 is shown which is a stack of layers including one or more bottom seed layers 10 such as NiFeCr formed on a bottom electrode 3. Next, an anti-ferromagnetic (AFM) pinning layer 11 that may be PtMn, for example, is deposited on the seed layer 10. There is a ferromagnetic "pinned" layer 12 also known as a reference layer on the AFM layer 11 that may be a composite of multiple layers including CoFe layers. The tunnel barrier layer 13 above the pinned layer 12 is generally comprised of an insulating material such as $Al_2O_3$. Above the tunnel barrier layer 13 is a ferromagnetic "free" layer 14 which may be another composite layer that includes NiFe, for example. At the top of the MTJ stack is one or more cap layers 15. In configurations where only one cap layer is employed, the cap layer 15 is comprised of conductive material such as Ru for making an electrical contact to the subsequently formed bit line 6. This MTJ stack has a so-called bottom reference layer configuration. Alternatively, the MTJ stack may have a top reference layer configuration in which a free layer is formed on a seed layer followed by sequentially forming a tunnel barrier, a reference layer, an AFM layer, and a cap layer.

In U.S. Pat. No. 6,654,278, a process is used to form a magnetization vortex with a net magnetic moment of zero in a reference magnetic region of an MTJ. An applied magnetic field causes the vortex center to shift in a direction orthogonal to the bit easy axis or to the net applied field.

An MTJ device is disclosed in U.S. Pat. No. 6,269,018 in which a free layer and pinned layer are approximately circular (isotropic) in shape and have a magnetization in the form of a vortex. When a write current flows through the MTJ, a self-field is produced that changes the magnetization vortex state of the free layer from a first predetermined handedness to a second predetermined handedness.

A magnetic element is described in U.S. Patent Application Publication 2004/0021539 in which a closed loop of ferromagnetic material has an even number of magnetic domains of opposite sense. For data storage, two circular loops with notches are stacked with one on top of the other wherein the domains of one loop are either parallel or anti-parallel to the domains of the second loop.

In U.S. Patent Application Publication 200210196658, a spin vortex is formed in a circular shaped first magnetic film of a storage element and then a vertical magnetization is generated at the center of the spin vortex. A second magnetic film has a magnetization perpendicular to its top and bottom surfaces.

A method of toroid reading and writing is disclosed in U.S. Pat. No. 6,266,289 in which a toroid element is interposed between two or four current conducting biasing busbars. One of the busbars extends into the axial opening of the toroid element to generate a vortex magnetic field therein and a second busbar generates a magnetic field that is transverse relative to the vortex field.

SUMMARY OF THE INVENTION

One objective of the present invention is to provide an MRAM cell structure based on an MTJ with an elliptical shape in which a free layer and a reference layer have a vortex magnetization.

A further objective of the present invention is to provide a method of forming a vortex magnetization in the free layer and reference layer according to the first objective that involves applying a first magnetic field in a first direction and then applying a second magnetic field in a direction opposite to the first direction.

Yet another objective of the present invention is to provide a method of switching the vortex magnetization in the free layer from a first rotational direction to a second rotational direction.

The first objective is achieved in an MRAM cell structure in which an MTJ is formed between a first conductive line and a second conductive line where the second conductive line crosses over the first conductive line. The MTJ advantageously has an elliptical shape with a flux closure configuration. In other words, the MTJ has an elliptically shaped sidewall, a top, and a bottom. In one embodiment, the aspect ratio (long axis length/short axis length) of the ellipse that determines the sidewall shape is less than 3. Alternatively, the ellipse has a shape represented by the combination of two half ellipses having unequal sized short axes and joined along the same long axis. In this case, the ratio of the long axis to the total width of the ellipse is less than 5. Preferably, the width of the first conductive line and the width of the second conductive line is greater than 50% of the lateral dimension (width) of the MTJ cell.

The MTJ has a bottom layer that may be a seed layer formed on the first conductive line. An anti-ferromagnetic (AFM) pinning layer is formed on the seed layer and a reference (pinned) layer is disposed on the AFM layer. Above the reference layer is sequentially formed a tunnel barrier layer, a free layer and a capping layer. In one embodiment, the reference layer has a magnetization vortex pinned in a clockwise rotation and the free layer has a magnetization vortex formed in either a clockwise rotation (low resistance state) or a counterclockwise rotation (high resistance state). Optionally, the reference layer has a magnetization vortex pinned in a counterclockwise rotation and the free layer has a magnetization vortex formed in a counterclockwise rotation (low resistance state) or in a clockwise rotation (high resistance state). The rotation of the magnetization vortex in the free layer may be changed by applying an external magnetic field along a first axis in a first direction that breaks the vortex and leaves the remnant magnetization generally aligned along the first axis. Then a smaller reverse magnetic field is applied along the first axis opposite to the first direction to induce a vortex magnetic state. Once the reverse field is removed, a remnant magnetization remains in a vortex configuration with a rotation opposite to that which existed before the two magnetic fields were applied.

A method of forming the vortex magnetization is disclosed wherein the net magnetic moment is essentially zero. The vortex state of magnetization in the free layer is achieved by breaking the symmetry of the cell shape as in the previously described elliptical shape formed by a combination of two half ellipses. First, a high magnetic field is applied to align the magnetization direction in the free layer along a first axis. Shape asymmetry causes a remnant magnetization curled at both ends of the elliptically shaped free layer which is called a "C" state. When a small reverse magnetic field is applied, the "C" state induces a vortex state. For example, when the magnetization is set along a +x direction by a high field, a smaller reverse magnetic field applied in the −x direction will form a vortex rotation in a clockwise direction. On the other hand, if the magnetization is initially set along a −x direction by the high field, a smaller reverse magnetic field applied in the +x direction will result in a vortex rotation in a counterclockwise direction.

For the reference layer, the magnetization vortex is generated in the following manner. The vortex is fixed (pinned) by applying a temperature above a certain critical temperature so that the AFM layer is in a paramagnetic phase and then cooling down to set the vortex pinning direction. In the case of a PtMn AFM layer, the MTJ is patterned to provide the intended elliptical shape without annealing the PtMn to its anti-ferromagnetic phase. At the annealing temperature of PtMn, a vortex state is induced in the reference layer and the PtMn layer is changed into an AFM phase. The vortex state is more easily induced in the free layer and reference layer by adding a dopant comprised of one or more of C, N, B, Ta, Pt, Zr, Nb, or Hf which reduces the exchange coupling constant.

BRIEF DESCRIPTION OF THE DRAWINGS

FIG. 1 is a cross-sectional view showing a conventional MRAM structure in which MTJs are sandwiched between a first conductive layer and a second conductive layer.

FIG. 2 is an enlarged view of an MTJ in FIG. 1 that depicts the various layers within the MTJ structure.

FIG. 3 is a cross-sectional view of an MRAM structure of the present invention in which an MTJ is formed between a first conductive layer and a second conductive layer and has sidewalls adjacent to an insulation layer.

DETAILED DESCRIPTION OF THE INVENTION

Figure 4:
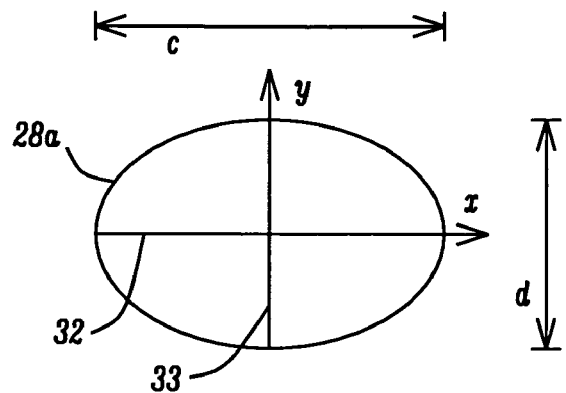
FIG. 4 is a top view of the MTJ in FIG. 3 that has an elliptical shape with a long axis and a short axis.

The present invention is an MRAM structure based on an MTJ in which a free layer and a reference layer have a vortex magnetization state with a net magnetic moment of about zero that is induced and switched by applying a first magnetic field in a first direction and then a smaller magnetic field in an opposite direction. The drawings are provided by way of example and are not intended to limit the scope of the invention. Although only one MRAM cell is depicted in the drawings, it is understood that there are a plurality of MRAM cells in an array that has multiple rows and columns on an MRAM chip. While the exemplary embodiment relates to an MTJ with a bottom spin valve configuration, those skilled in the art will appreciate that the present invention also applies to a top spin valve configuration.

Referring to FIG. 3, a portion of an MRAM structure 20 is shown that includes a substrate 21 which may be silicon or another semiconductor substrate used in the art. The substrate 21 typically contains other devices such as transistors and diodes. A first conductive line 22 comprised of an electrical conductive material such as Cu is formed on the substrate 21 by a well known technique and preferably has a thickness less than 5000 Angstroms. Typically, the first conductive line 22 is coplanar with a first insulation layer (not shown) and is formed in an array of first conductive lines. The array of first conductive lines may be comprised of parallel word lines, parallel bit lines, or sectioned lines. Each first conductive line 22 may be clad on the sides and bottom with a magnetic layer such as NiFe, CoFe, CoNiFe, or other Co, Ni, or Fe alloys which is formed by a conventional method. The top of the first conductive line 22 which faces a subsequently formed free layer 27 is not clad. The thickness of the magnetic cladding layer is about 10 to 5000 Angstroms.

An MTJ 30 is formed on the first conductive line 22 by a method known to those skilled in the art. Generally, an MTJ stack of layers is sputter deposited on the array of first conductive lines and adjoining first insulation layer and then a patterning and etching sequence is followed to generate a plurality of MTJs on the first conductive lines wherein each MTJ has a top, bottom, and sidewall. Subsequently, a second insulation layer 29 comprised of silicon oxide or a low k dielectric material is deposited to cover the MTJs and is then planarized to be coplanar with the top surface 28a of the MTJ 30.

The bottom layer in the MTJ 30 is typically a seed layer 23 such as NiFeCr that promotes uniform and densely packed growth in subsequently formed layers. Above the seed layer 23 is an AFM pinning layer 24 which in one embodiment is PtMn although NiMn, OsMn, IrMn, RuMn, RhMn, PdMn, RuRhMn, or CrPdMn may also be employed as the AFM layer which is used to pin the magnetization direction in an overlying reference layer 25. The reference layer 25 is preferably comprised of one or more of Ni, Co, and Fe or an alloy thereof and has a thickness between about 10 and 200 Angstroms. An important feature of the present invention is that the reference layer 25 is further comprised of a dopant that has a concentration of about 1% to 40% by weight and is one or more of C, N, B, Zr, Ta, Pt, Nb, or Hf. The dopant is needed to reduce the exchange coupling constant in the reference layer to facilitate the formation of a vortex magnetization state which will be explained in a later section. Optionally, the reference layer 25 may be a synthetic anti-parallel pinned (SyAP) layer in which two ferromagnetic layers such as CoFe of slightly different thicknesses are separated by a thin Ru, Rh, Cr, or Cu coupling layer that maintains strong anti-parallel magnetic coupling between the two ferromagnetic layers. Note that the dopant is not added to the coupling layer in the SyAP reference layer embodiment.

A tunnel barrier layer 26 is disposed on the reference layer 25. In one embodiment, an Al layer is sputter deposited on the reference layer and is subsequently oxidized to form a tunnel barrier layer 26 comprised of $AlO_x$ with a thickness of about 11 to 15 Angstroms before the remaining MTJ layers are sputter deposited.

There is a free layer 27 formed on the tunnel barrier layer 26 that preferably has a thickness of about 10 to 200 Angstroms and which may be a composite layer. Like the reference layer 25, the free layer 27 is comprised of one or more of Ni, Co, and Fe or an alloy thereof and has a dopant concentration between about 1% and 40% by weight of one or more of C, N, B, Zr, Ta, Pt, Nb, or Hf. Furthermore, the free layer 27 may be a synthetic anti-ferromagnetic (SAF) layer in which two ferromagnetic layers such as NiFe are separated by a Ru, Rh, Cu, or Cr coupling layer. Alternatively, the free layer 27 may be a composite layer in which a first ferromagnetic layer is anti-parallel magneto-statically coupled to a second ferromagnetic layer through a non-ferromagnetic metal spacer. The metal spacer such as Cr, Ta, Ag, Au, Zr, NiCr, or NiFeCr has a proper thickness to prevent exchange coupling of magnetization between the two ferromagnetic layers. When the free layer has a SAF configuration, the first ferromagnetic layer adjacent to the tunnel barrier layer 26 has a vortex rotation in one direction and the second ferromagnetic layer has a vortex rotation in the opposite direction that results in a net magnetic moment in the free layer of about zero.

The top layer in the MTJ 30 is a cap layer 28 with a thickness of about 50 to 400 Angstroms and which is typically a conductive material such as Cu, Ru, or a composite layer with an upper Ru layer.

A second conductive line 31 is formed on the top surface 28a and adjacent second insulation layer 29 by a conventional method and is part of an array of second conductive lines comprised of parallel bit lines or parallel word lines. An MTJ similar to MTJ 30 is formed between a second conductive line and first conductive line at each location where a second conductive line crosses over a first conductive line. It is understood that the first and second conductive lines in the MRAM structure may be formed by a well known damascene process or by a non-damascene method wherein a sheet metal film is deposited on a substrate and is then patterned to form conductive lines. As appreciated by those skilled in the art, the second conductive line 31 may be comprised of an electrically conductive material such as Cu that is cladded on its top and sides by a magnetic layer. The thickness of the electrically conductive material is preferably less than 5000 Angstroms. The bottom of the second conductive line 31 which faces the top surface 28a is not covered by a magnetic cladding layer. For the purpose of this discussion, the second conductive line will be hereafter referred to as a bit line 31 and the first conductive line will hereafter be referred to as a word line 22. In one aspect, the bit line 31 is aligned orthogonal to the word line 22. In a read operation, a sense current is directed through the MTJ 30 along the z-axis between word line 22 and bit line 31.

Referring to FIG. 4, a top view of the top surface 28a of the MTJ is depicted. It is understood the each of the layers in the MTJ 30 has the same shape as the top surface 28a. In one embodiment, the top surface 28a has an elliptical shape in which the long axis 32 is formed along the x axis and has a length c. The short axis 33 is formed along the y axis and has a length d. Preferably, the ratio c/d is less than about 3. Thus, the MTJ 30 is comprised of an elliptically shaped sidewall, a top surface 28a, a bottom, and a thickness between the top surface and bottom that is generally between about 50 and 1000 Angstroms. Although the long axis coincides with the x-axis and the short axis coincides with the y-axis in the exemplary embodiment, the designation of x and y axes could be switched. In other words, the long axis may be formed along the y-axis and the short axis may be formed along the x-axis.

Figure 5:
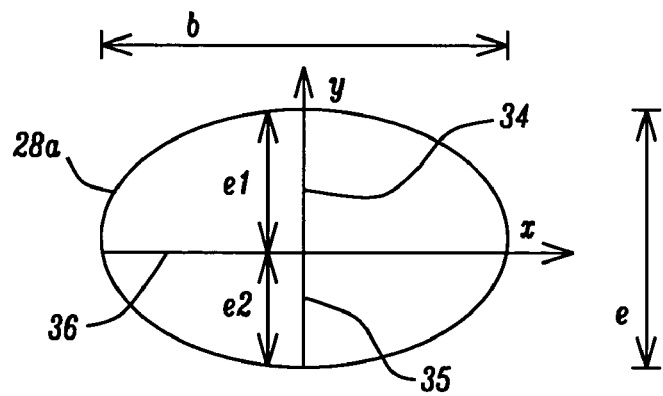
FIG. 5 is a top view of an alternative embodiment of the MTJ in the present invention where the ellipse is formed by a combination of two half ellipses that are joined along the same long axis.

Referring to FIG. 5, an alternative embodiment is shown in which the top surface 28a of the MTJ is in the shape of an asymmetric ellipse that has a long axis 36 with a length b formed along the x-axis. The ellipse is a combination of two half ellipses (not shown) that have short axes 34, 35 with dimensions e1 and e2, respectively, wherein e1>e2 and e1+e2 equals the total width e of the asymmetric ellipse. The two half ellipses are joined along the x-axis. In this case, the ratio of the length b to the width e is preferably less than about 5. Optionally, the long axis 36 may be formed along the y-axis and the short axes 34, 35 may be formed along the x-axis.

Figure 6:
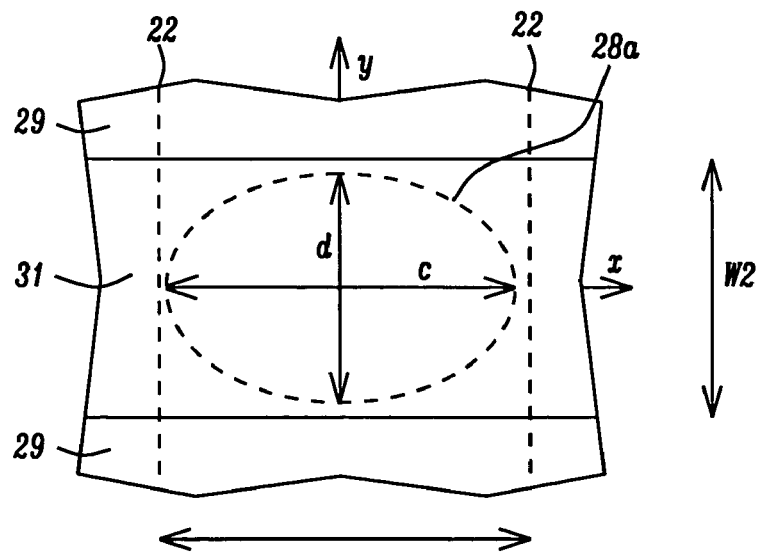
FIG. 6 is a top view of the MTJ in FIG. 3 showing its location relative to the first and second conductive layers.

Referring to FIG. 6, a top view of the top surface 28a of the capping layer 28 in the MTJ 30 is shown in relation to the word line 22 and the bit line 31. An insulation layer that is typically formed coplanar with the bit line 31 has been removed to reveal the second insulation layer 29. Preferably, the width $w_1$ of the word line 22 is greater than 50% of the width d of the MTJ 30 and top surface 28a. The width $w_2$ of the bit line 31 is preferably greater than the width d of the top surface 28a. Typically, the width d and the length c are less than 5 microns.

Figure 7:
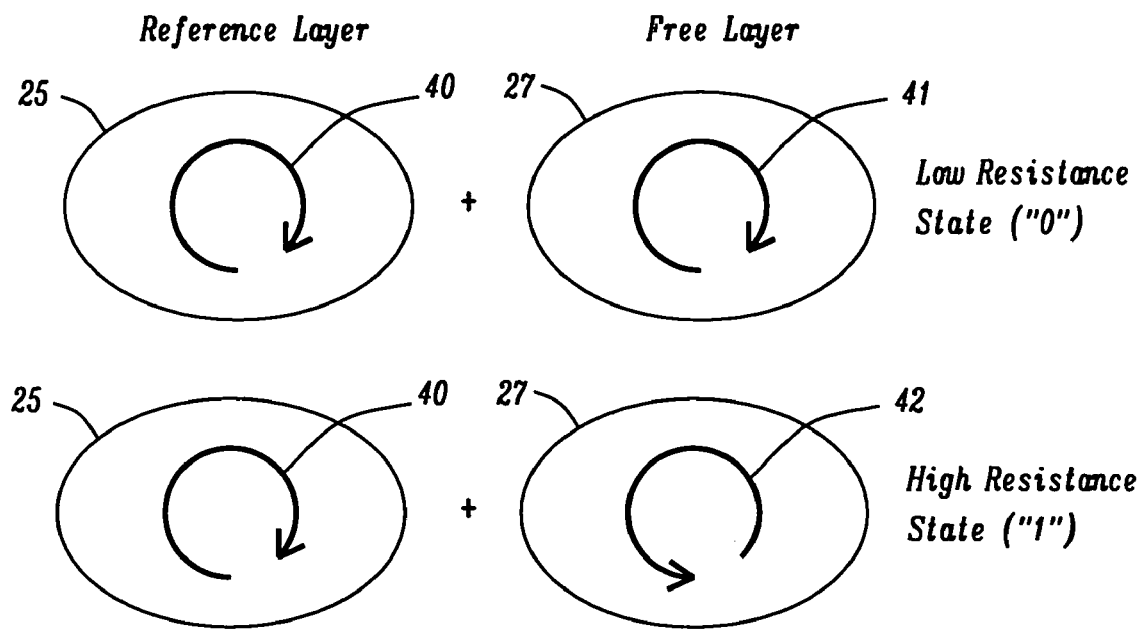
FIG. 7 shows how the vortex rotation in the free layer and reference layer determines the low and high resistance states of the MTJ.

Both of the aforementioned elliptical shapes shown in FIGS. 4, 5 allow a vortex magnetization state with either a clockwise rotation or a counterclockwise rotation to be formed in the reference layer 25 and free layer 27. The method of vortex formation will be explained in a later section. Referring to FIG. 7, an embodiment is pictured wherein the reference layer 25 has a vortex magnetization 40 with a clockwise rotation and the free layer 27 has a vortex magnetization 41 with a clockwise rotation that result in a low resistance state "0". Optionally, both the reference layer 25 and free layer 27 could have a vortex magnetization with a counterclockwise rotation to produce a low resistance state. Also shown in FIG. 7 is a configuration where the reference layer has a vortex magnetization 40 with a clockwise rotation and the free layer 27 has a vortex magnetization 42 with a counterclockwise rotation that produces a high resistance state "1". Those skilled in the art will realize that the same high resistance state would result if the reference layer and free layer have vortex magnetizations with counterclockwise and clockwise rotations, respectively. In all cases, a flux closure configuration is achieved that does not generate charges at the edge of the MTJ.

The switching behavior in the free layer of the present invention is more dependent on intrinsic film properties such as exchange coupling constant and Mst (magnetic flux saturation x thickness value) than on shape anisotropy. Thus, much higher coercivity is obtained compared to a conventional MTJ based on shape anisotropy. Moreover, an MTJ having ferromagnetic layers with high coercivity and an elliptical shape according to the present invention enables a smaller MRAM cell to be formed which is required for very dense MRAM arrays. Additionally, the higher coercivity provided by the present invention enhances the stability of stored bits and significantly increases the resistance to erasure for half-selected MTJ cells during a write operation. Moreover, a low aspect ratio elliptical MTJ is easy to process and ideal for high density arrays.

Figure 8A:
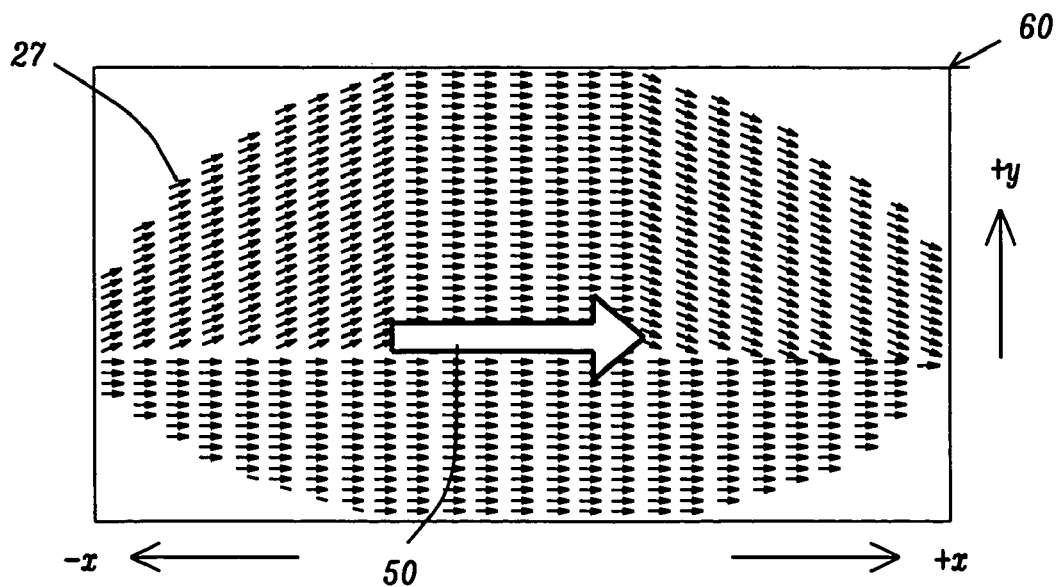
FIGS. 8a, 8b, 9a, 9b are computer simulations that show how the vortex rotational direction is determined by the initial magnetization direction in a magnetic layer.
Figure 8B:
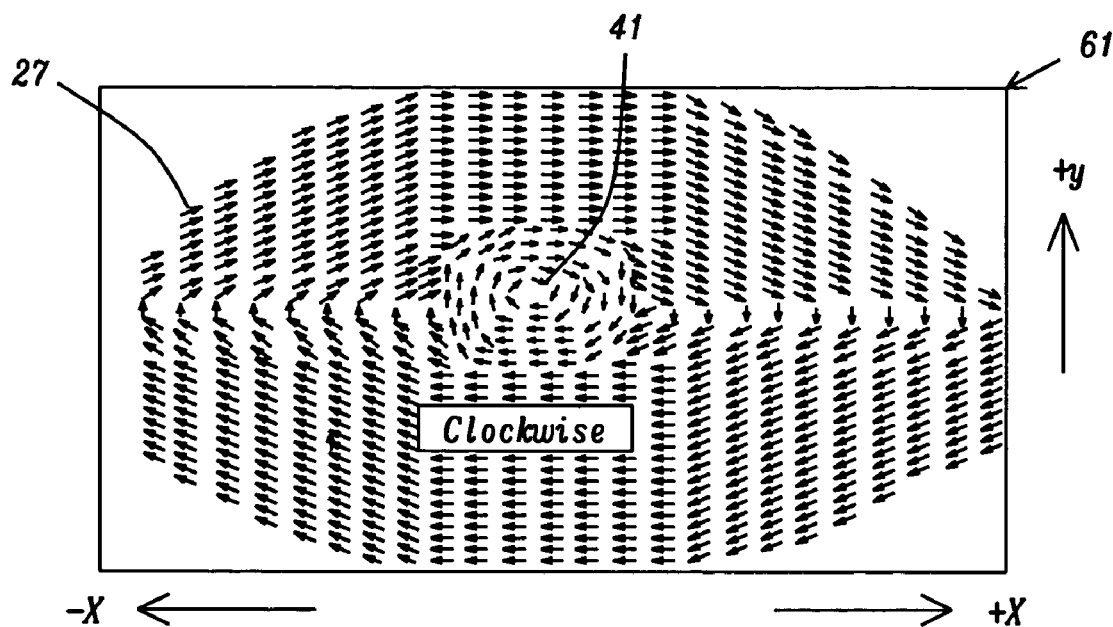

In FIGS. 8a and 8b, computer simulations are illustrated to demonstrate how a vortex magnetization in a free layer 27 is formed. The plurality of small arrows within the free layer represent the magnetization direction at various (x,y) coordinates in a horizontal plane that is parallel to the substrate 21. The x-axis is defined as the direction along the long axis of the elliptically shaped free layer and the y-axis is the direction along the short axis of the free layer. In these plots, the ratio of the long axis to the short axis is 1.5 and the thickness of the free layer 27 is 80 Angstroms with an Ms value of 600 emu/cc. In simulation 60 (FIG. 8a), the magnetization direction 50 of the free layer 27 is initially set along the +x axis by applying a first magnetic field of about 100 to 250 Oersted in the +x direction and then removing the first field. Although the remnant magnetization is generally pointed parallel to the x axis, there is a slight curl in the magnetization at each end of the free layer which is called a "C" state. Next, a vortex magnetization is induced by applying a second magnetic field that is smaller than the first field and which is applied in the −x direction. Simulation 61 (FIG. 8b) shows the vortex magnetization 41 formed after applying a second field with a magnitude of 75 Oersted in the −x direction and then removing the second field. It is important that the magnitude of the second field reaches a value (nucleation field) which induces a vortex formation. After the second field is removed, the vortex magnetization 41 is retained with a clockwise rotation. Note that the length of time during which the first and second fields are applied is not critical.

Figure 9A:
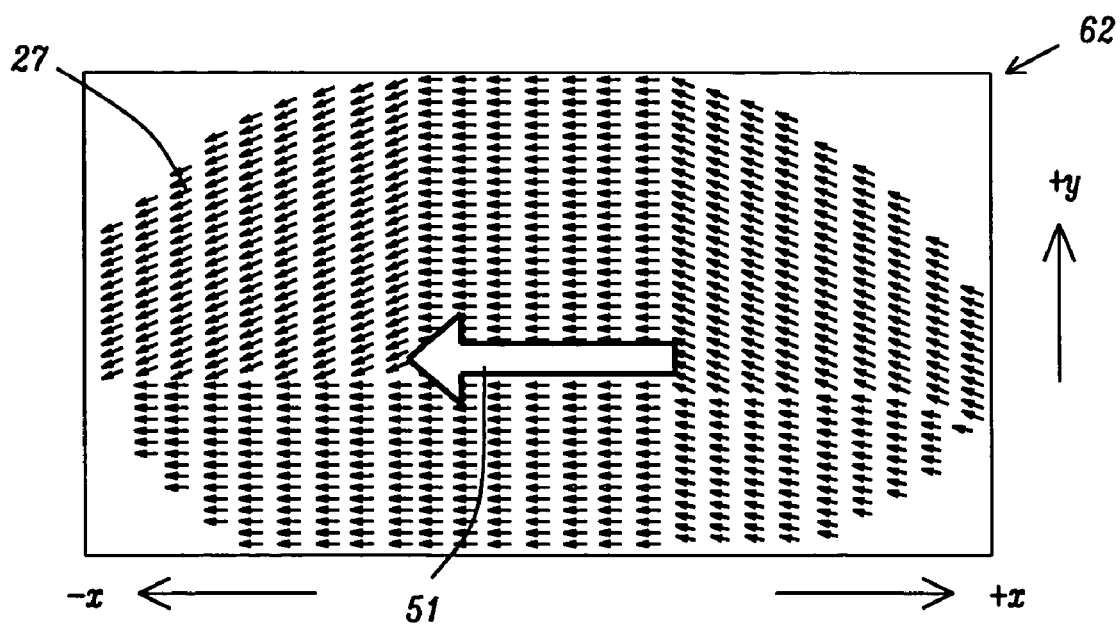
Figure 9B:
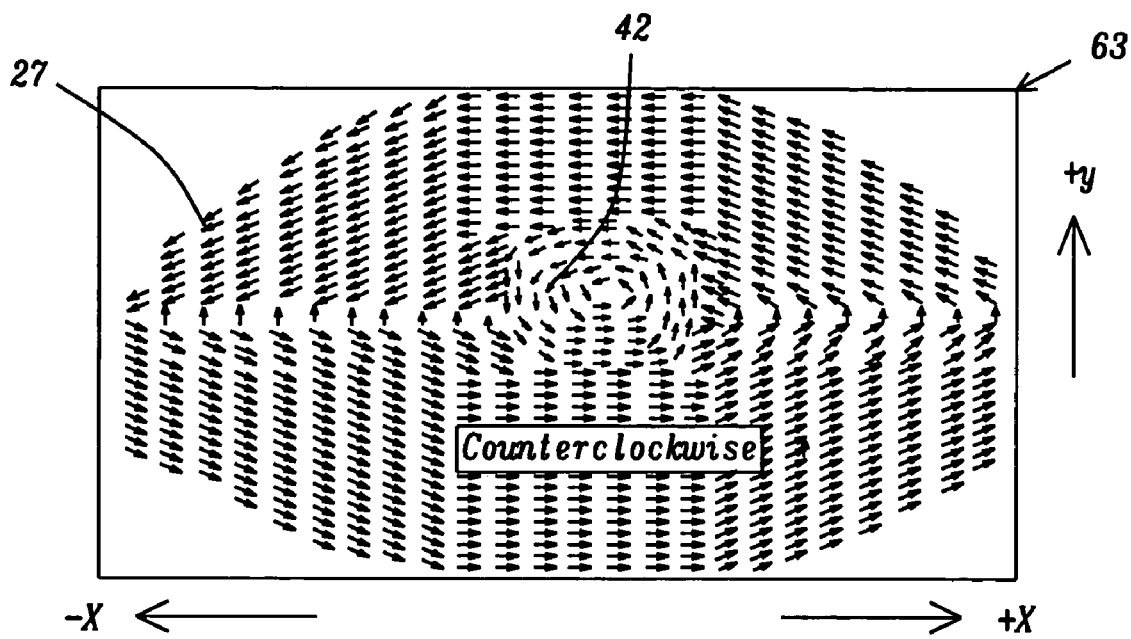

In FIGS. 9a and 9b, computer simulations demonstrate how a counterclockwise rotation in a vortex magnetization is formed in a free layer 27. In simulation 62 (FIG. 9a), the magnetization direction 51 of the free layer 27 is initially set along the −x axis by applying a first magnetic field of about 100 to 250 Oersted in the −x direction and then removing the first field. A so called "C" state is generated at each end of the free layer. Next, a vortex magnetization is induced by applying a second magnetic field that is smaller than the first field and which is applied in the +x direction. Simulation 63 (FIG. 9b) shows the vortex magnetization 42 formed after applying a second field with a magnitude of 75 Oersted in the +x direction and then removing the second field. It is important that the magnitude of the second field reaches a critical value that is the nucleation field which induces a vortex formation. Once the second field is removed, the vortex magnetization 42 is retained with a counterclockwise rotation.

Figure 10:
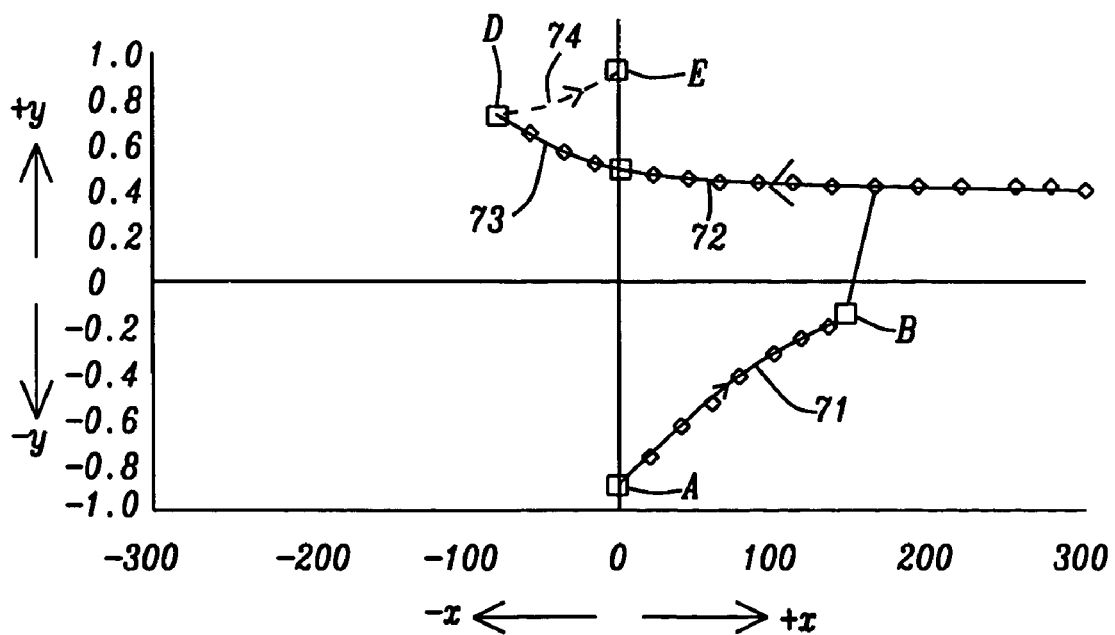
FIGS. 10 and 11 are plots that demonstrate how a vortex rotation in a free layer is switched from one direction to an opposite direction by applying a first field along the x-axis and then a smaller reverse field along the x-axis.
Figure 12:
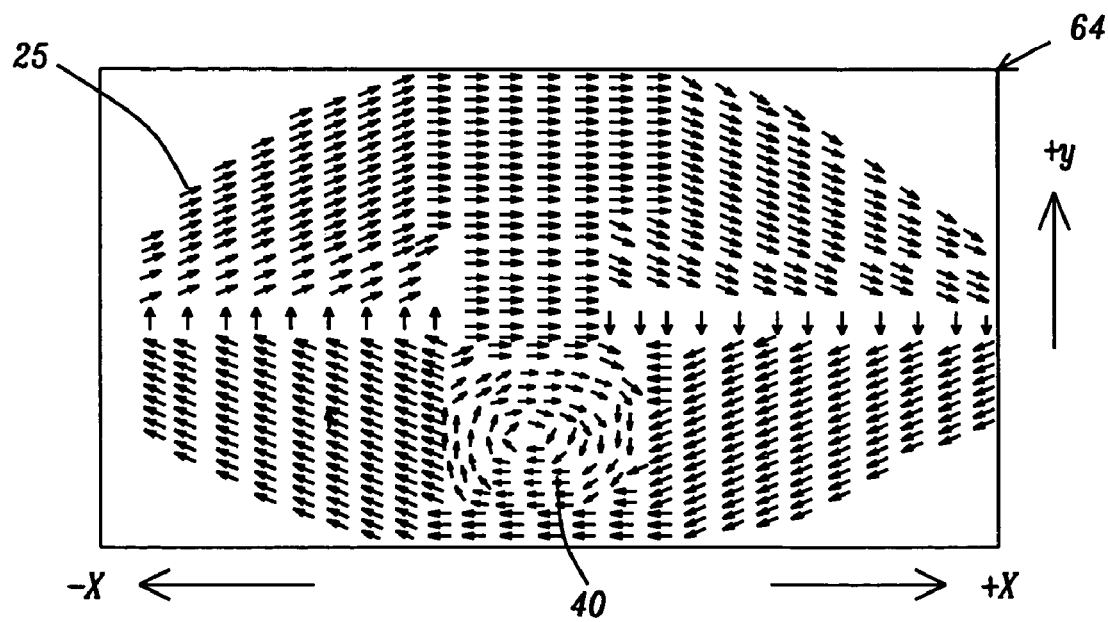
FIG. 12 is a computer simulation that depicts a vortex magnetization state in a reference layer of a MTJ.
Figure 13:
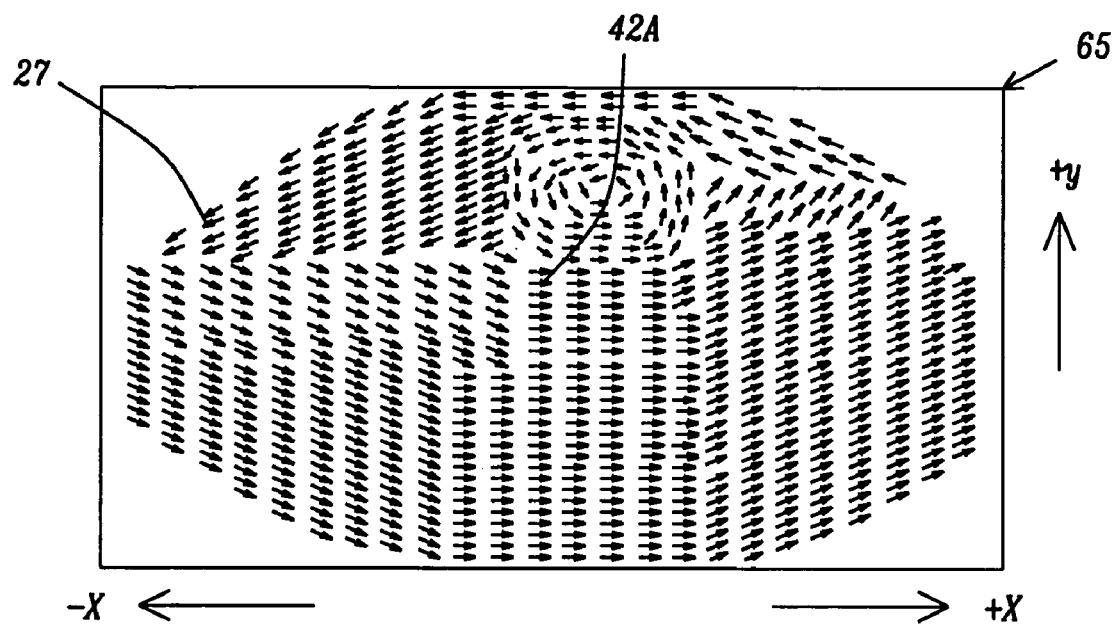
FIGS. 13–16 depict magnetization states in a free layer at various stages of switching a vortex rotation from one direction to an opposite direction.
Figure 14:
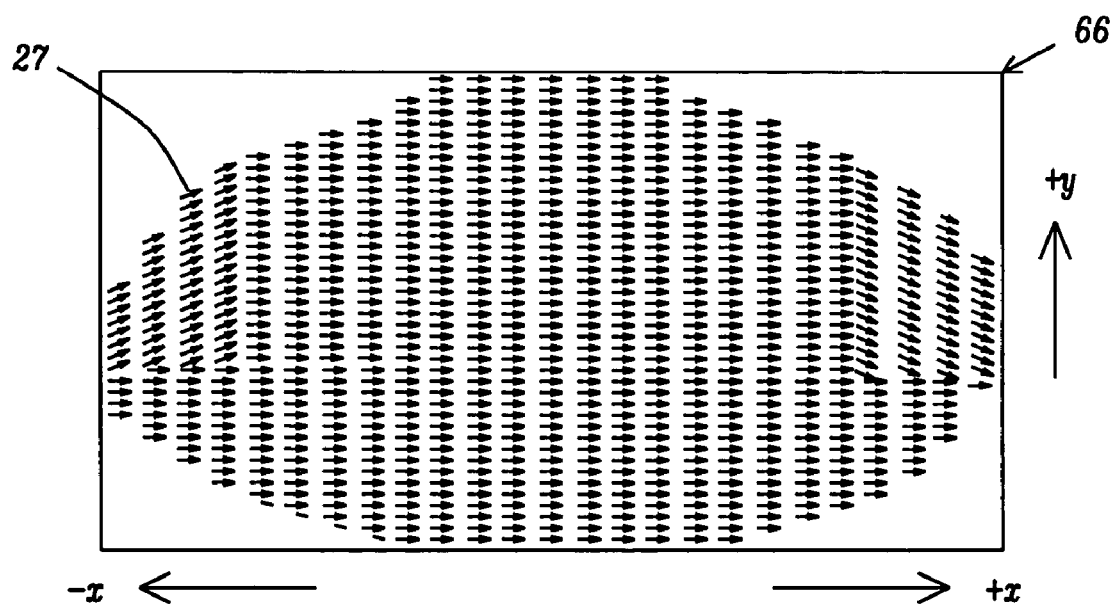
Figure 15:
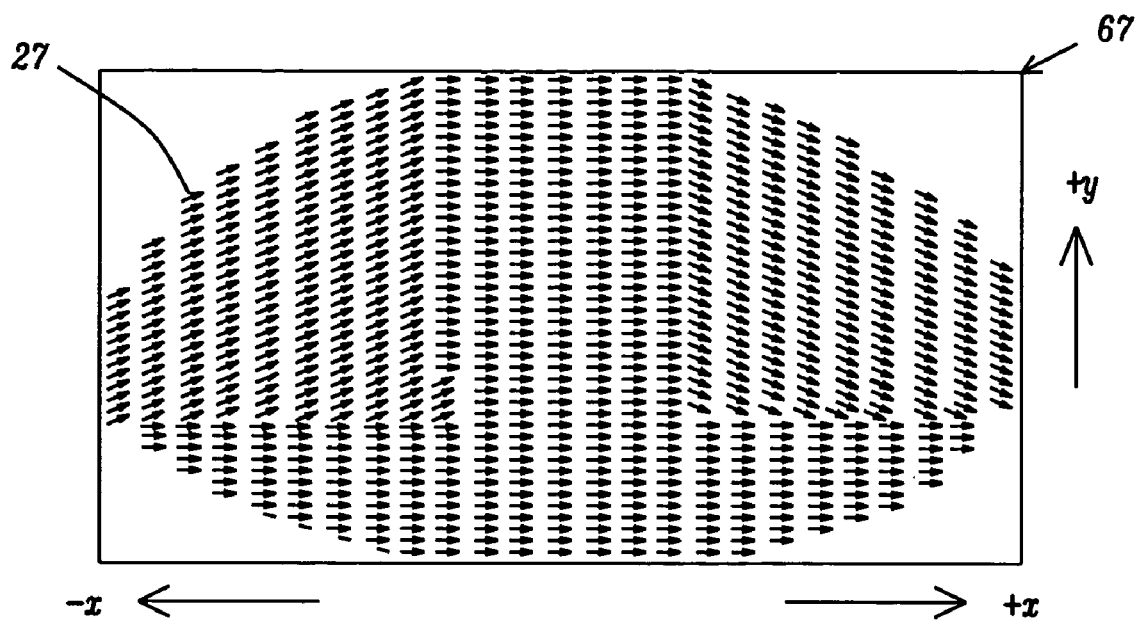
Figure 16:
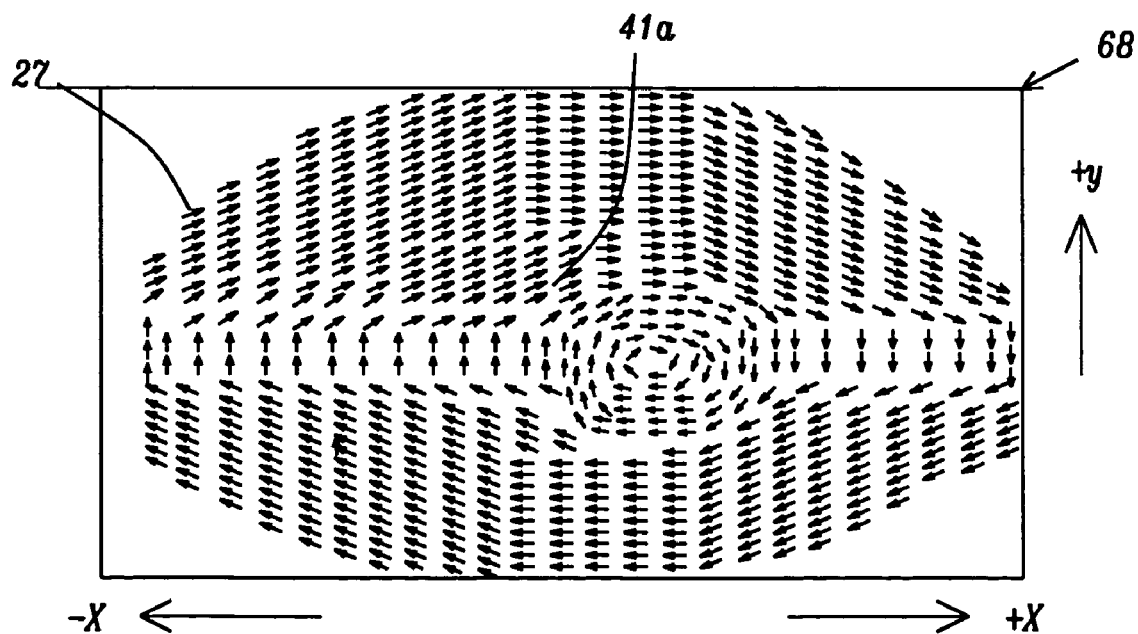

Referring to FIG. 10, a switching mechanism is depicted in a computer modeling diagram in which the x-axis is the applied magnetic field and the y-axis is the magnetic response equivalent to the resistance. In this embodiment, the free layer 27 has a vortex magnetization in a counter-clockwise direction as represented in FIG. 9b and the reference layer 25 has vortex magnetization pinned in a clockwise direction as indicated by the computer simulation 64 (FIG. 12). Beginning at point A, the MTJ is in a high resistance state. The MTJ is changed to a low resistance state at point E by switching the vortex rotation in the free layer 27. The procedure involves applying a first magnetic field in the +x direction which is provided by currents in a word line 22 and bit line 31. The magnitude of the first field is increased along the curve 71 up to a point B in a first step. As a result, the vortex 42a is shifted upward (orthogonal to the first field) with more magnetization oriented parallel to the x-axis as illustrated in computer simulation 65 (FIG. 13). When the first field is increased beyond the critical point B, the vortex 42a is broken and the magnetization direction is generally in the +x direction as shown by computer simulation 66 (FIG. 14). After the first field is removed (curve 72), the remnant magnetization (point C) is aligned in the +x direction but is in a "C" state as indicated by simulation 67 (FIG. 15). Next, a smaller second magnetic field is applied in the −x direction. Curve 73 shows how the resistance changes as the second field is increased. At a second critical point D, a vortex magnetization 41a with a clockwise rotation is induced in the free layer 27 (FIG. 16). After the second field is removed, the remnant magnetization retains a vortex configuration along curve 74 and still has a clockwise rotation after reaching a low resistance state at point E. The vortex 41a will shift along the y-axis after the second field is removed to settle into a low energy state.

In the exemplary embodiment, the critical point B is at 156 Oersted and the second critical point D is at −60 Oersted (Oe) when the free layer 27 has a thickness of 80 Angstroms and an Ms value of 600 emu/cc. Of course, the critical point values B, D can vary depending on the Ms value, thickness, and shape of the free layer. In an actual operation, it is understood that the first field is typically applied at greater than or equal to 156 Oe and is not ramped to a point B. Likewise, the second field is immediately applied with a value of −60 Oe without a ramp program. Typically, the first field and second field are applied for a period of about 1 to 100 nanoseconds. Furthermore, the delay time between the first field and the second field is not critical and may vary from 0 to about 10 nanoseconds.

Figure 11:
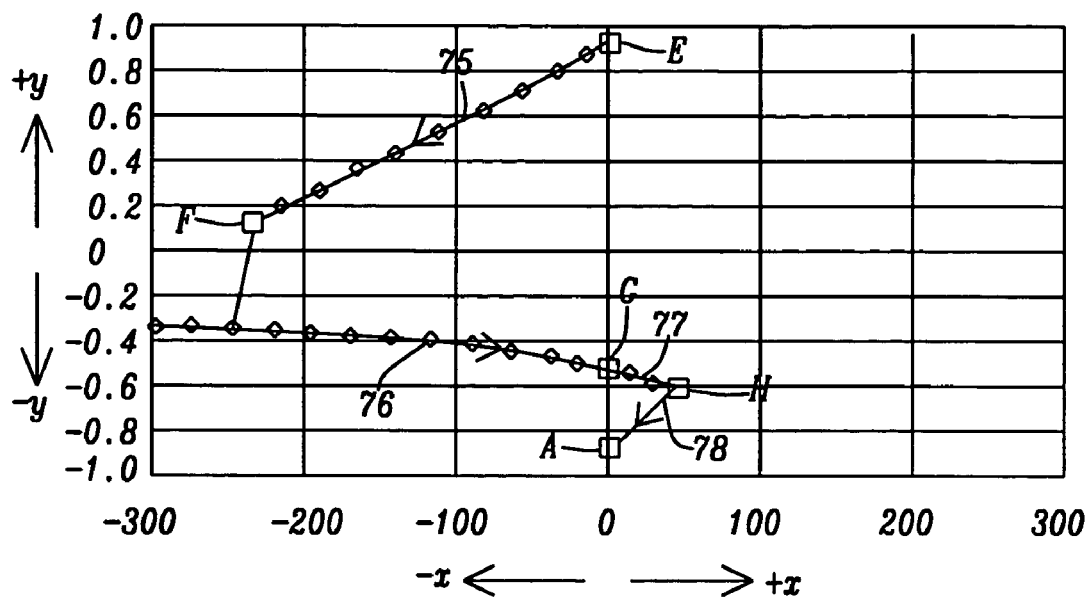

Referring to FIG. 11, a switching mechanism is depicted in a computer modeling diagram in which the MTJ is changed from a low resistance state to a high resistance state. In this embodiment, the free layer 27 has a vortex magnetization in a clockwise direction as represented in FIG. 8b and the reference layer 25 has vortex magnetization pinned in a clockwise direction as indicated by the computer simulation 64 (FIG. 12). Beginning at point E, the MTJ is in a low resistance state. The MTJ is changed to a high resistance state at point A by switching the vortex rotation in the free layer 27. The procedure involves applying a first magnetic field in the −x direction which is provided by currents in a word line 22 and bit line 31. The magnitude of the first field may be increased along the curve 75 up to a point F in a first step although typically a ramp program is not employed and a first field with a value equal to or greater than that of point F is immediately applied. At point F, the vortex is shifted orthogonal to the first field with more magnetization oriented parallel to the x-axis in the −x direction. When the first field is increased beyond the critical point F, the vortex is broken and the magnetization direction is generally aligned in the −x direction. After the first field is removed (curve 76), the remnant magnetization (point G) is aligned in the −x direction but is in a "C" state. Next, a smaller second magnetic field is applied in the +x direction. Curve 77 shows how the resistance changes as the second field is increased. At a second critical point H, a vortex magnetization with a counterclockwise rotation is induced in the free layer 27 similar to that shown in FIG. 9b. The second field may be immediately applied with a value equal to or greater than that of point H. The delay time between the first field and second field is preferably 0 to about 10 nanoseconds. After the second field is removed, the remnant magnetization retains a vortex configuration along curve 78 and still has a counterclockwise rotation after reaching a high resistance state at point A. In the exemplary embodiment, the critical point F is at −240 Oersted and the second critical point H is at +140 Oersted. However, the critical point values F, H can vary depending on the Ms value, thickness, and shape of the free layer.

The method of switching a vortex magnetic state is reliable and more selective than switching a conventional MTJ with shape anisotropy since an MTJ with a vortex magnetization has a flux closure configuration and a higher coercivity due to its low aspect ratio elliptical shape.

An important feature in pinning a vortex magnetization state in the reference layer 25 is that the vortex magnetization must be generated before the underlying AFM layer 24 which "fixes" the vortex formation is annealed. When the AFM layer 24 is comprised of PtMn, for example, the MTJ is patterned to its desired shape without annealing the AFM layer to its anti-ferromagnetic phase. Next, a vortex state is induced in the reference layer 25 by applying a first field in a first direction such as along the +x-axis and then applying a second field of lesser magnitude in a direction opposite to the first direction. Then the wafer is annealed to change the PtMn layer or equivalent into its AFM phase. At this point, the vortex state of the reference layer is pinned in either a clockwise or counterclockwise rotation. Alternatively, the vortex state of the reference layer 25 may be pinned by first heating the substrate 21 above the Neel temperature of the AFM layer 24 as appreciated by those skilled in the art and then inducing the vortex state in the reference layer followed by cooling down the substrate without a magnetic field to freeze the vortex state of the reference layer.

While this invention has been particularly shown and described with reference to, the preferred embodiment thereof, it will be understood by those skilled in the art that various changes in form and details may be made without departing from the spirit and scope of this invention.

We claim:

1. A magnetic tunnel junction (MTJ) having a length and width formed between a first conductive line and a second conductive line in an MRAM structure, comprising:
   (a) a free layer having a dopant for lowering the exchange coupling constant therein, said free layer has a vortex magnetization with a rotational direction;
   (b) a reference layer having a dopant for lowering the exchange coupling constant therein, said reference layer has a vortex magnetization with a rotational direction that is pinned by an adjacent anti-ferromagnetic (AFM) layer; and
   (c) a tunnel barrier layer formed between said free layer and reference layer.

2. The MTJ of claim 1 wherein the rotational directions of the free layer and reference layer are both clockwise or both counterclockwise and produce a low resistance state.

3. The MTJ of claim 1 wherein the rotational direction of the free layer is opposite to the rotational direction of the reference layer which produces a high resistance state.

4. The MTJ of claim 1 wherein the length and a width of said MTJ is defined by an elliptically shaped sidewall with a thickness, a top, and a bottom in which the bottom is formed on the first conductive line, the top contacts the second conductive line, and the ellipse that determines the sidewall shape has an aspect ratio (length/width) lower than about 3 in which a long axis dimension is said length and a short axis dimension is said width.

5. The MTJ of claim 1 wherein the MTJ has an asymmetric elliptically shaped sidewall with a thickness, a top, and a bottom in which the bottom is formed on the first conductive line, the top contacts the second conductive line, and the asymmetric ellipse that determines the sidewall shape is formed by combining two half ellipses that have the same long axis and are joined along the long axis wherein the first half ellipse has a first short axis dimension and the second half ellipse has a second short axis dimension that is less than the first short axis dimension.

6. The MTJ of claim 5 wherein said asymmetric ellipse has a length along the long axis and a width which is the total of the first and second short axis dimensions and wherein the ratio of length to width is less than about 5.

7. The MTJ of claim 1 wherein said free layer and reference layer are comprised of one or more of Ni, Fe, and Co, or alloys thereof, and said dopant is one of C, N, B, Zr, Ta, Pt, Nb, or Hf with a concentration of about 1% to 40% by weight.

8. The MTJ of claim 1 wherein said AFM layer is comprised of PtMn, NiMn, OsMn, IrMn, RuMn, RhMn, PdMn, RuRhMn, or CrPdMn.

9. The MTJ of claim 1 wherein said reference layer has a SyAP configuration in which a coupling layer comprised of Rh, Ru, Cr, or Cu is formed between two ferromagnetic layers.

10. The MTJ of claim 1 wherein said free layer has a SAF configuration in which a coupling layer comprised of Rh, Ru, Cr, or Cu is formed between two ferromagnetic layers.

11. The MTJ of claim 1 wherein said free layer is a composite layer in which a first ferromagnetic layer is anti-parallel magneto-statically coupled to a second ferromagnetic through a non-ferromagnetic metal spacer.

12. The MTJ of claim 1 wherein the second conductive line is a bit line comprised of an electrical conductive non-magnetic layer that has a thickness less than 5000 Angstroms and has a width that is greater than the width of the MTJ.

13. The MTJ of claim 1 wherein the first conductive line is a word line comprised of an electrical conductive material that has a thickness less than 5000 Angstroms and has a width that is greater than 50% of said width of the MTJ.

14. The MTJ of claim 1 wherein the second conductive line and the first conductive line each have four sides including one side that contacts said MTJ and wherein a magnetic cladding layer is formed on the three sides that do not contact the MTJ.

15. The MTJ of claim 1 wherein said free layer has a thickness of about 10 to 200 Angstroms and said reference layer has a thickness between about 10 and 200 Angstroms.

16. An MRAM structure formed on a substrate, comprising:
(a) an array of first conductive lines formed on a first horizontal plane;
(b) an array of parallel second conductive lines oriented in a direction orthogonal to the first conductive lines and in a second horizontal plane that is parallel to and formed above the first horizontal plane; and
(c) an array of MTJs disposed between said first horizontal plane and said second horizontal plane wherein an MTJ is formed at each location where a second conductive line crosses over a first conductive line, said MTJs are comprised of:
(1) a free layer having a dopant for lowering the exchange coupling constant therein, said free layer has a vortex magnetization with a rotational direction;
(2) a reference layer having a dopant for lowering the exchange coupling constant therein, said reference layer has a vortex magnetization with a rotational direction that is pinned by an adjacent anti-ferromagnetic (AFM) layer; and
(3) a tunnel barrier layer formed between said free layer and reference layer.

17. The MRAM structure of claim 16 wherein the MTJ has a length and width defined by an elliptically shaped sidewall with a thickness, top, and bottom in which the bottom is formed on a first conductive line and the top contacts a second conductive line.

18. The MRAM structure of claim 17 wherein the ellipse that determines the sidewall shape has a long axis dimension which is said length, a short axis dimension that is said width, and the ratio of said length to said width is less than about 3.

19. The MRAM structure of claim 17 wherein the ellipse that determines the sidewall shape is formed by combining two half ellipses that have the same long axis dimension and are joined along the long axis wherein the first half ellipse has a first short axis dimension and the second half ellipse has a second short axis dimension less than the first short axis dimension.

20. The MRAM structure of claim 19 wherein said ellipse has a length along the long axis and a width which is the total of the first and second short axis dimensions wherein the ratio of the length to the width is less than about 5.

21. The MRAM structure of claim 17 wherein said MTJ has a length and a width that are less than about 5 microns.

22. The MRAM structure of claim 16 wherein said free layer and reference layer are comprised of one or more of Ni, Fe, and Co, or alloys thereof, and said dopant is one of C, N, B, Zr, Ta, Pt, Nb, or Hf with a concentration of about 1% to 40% by weight.

23. The MRAM structure of claim 16 wherein said AFM layer is comprised of PtMn, NiMn, OsMn, IrMn, RuMn, RhMn, PdMn, RuRhMn, or CrPdMn.

24. The MRAM structure of claim 16 wherein said reference layer is a composite layer with a SyAP configuration in which a coupling layer comprised of Rh, Ru, Cr, or Cu is formed between two ferromagnetic layers.

25. The MRAM structure of claim 16 wherein said free layer is a composite layer with an SAF configuration in which a coupling layer comprised of Rh, Ru, Cr, or Cu is formed between two ferromagnetic layers.

26. The MRAM structure of claim 16 wherein said free layer is a composite layer in which a first ferromagnetic layer is anti-parallel magneto-statically coupled to a second ferromagnetic through a non-ferromagnetic metal spacer.

27. The MRAM structure of claim 16 wherein the second conductive line is a bit line and the first conductive line is a word line that each have a thickness of less than about 5000 Angstroms.

28. The MRAM structure of claim 27 wherein one or both of said word line and bit line are comprised of a magnetic cladding layer formed on an electrical conductive layer wherein the magnetic cladding layer does not cover the side of the electrical conductive layer that faces said MTJ.

29. The MRAM structure of claim 17 wherein said first conductive line has a width that is greater than 50% of the width of said MTJ and the second conductive line has a width that is greater than the width of said MTJ.

30. The MRAM structure of claim 16 wherein the rotational directions of the free layer and reference layer are both clockwise or both counterclockwise which produces a low resistance state in said MTJ.

31. The MRAM structure of claim 16 wherein the rotational direction of the free layer is opposite to the rotational direction of the reference layer which produces a high resistance state in said MTJ.

32. A method of forming a vortex magnetization state in a magnetic layer in an MTJ, comprising:
(a) providing a substrate on which a first conductive line is formed along a first axis;
(b) forming an MTJ on said first conductive line, said MTJ has an elliptically shaped sidewall, top and bottom surfaces, a length and a width, and is comprised of a reference magnetic layer and a free magnetic layer in which a remnant magnetization is aligned in a first direction;
(c) forming a second conductive line that contacts the top surface of said MTJ and is formed along a second axis orthogonal to said first axis;
(d) generating currents in said first and second conductive lines that produce a reverse magnetic field in a second direction opposite to the first direction, said reverse magnetic field induces a vortex magnetization state in said free magnetic layer; and
(e) removing said reverse magnetic field.

33. The method of claim 32 wherein forming said MTJ comprises applying a high magnetic field in the first direction that produces said remnant magnetization and wherein said reverse magnetic field is smaller than the high magnetic field.

34. The method of claim 32 wherein a first vortex magnetization is formed in the free magnetic layer and a second vortex magnetization is formed in the reference magnetic layer.

35. The method of claim 34 wherein the first vortex magnetization and the second vortex magnetization both have a clockwise or counterclockwise rotation to produce a low resistance state in said MTJ.

36. The method of claim 34 wherein the first vortex magnetization has a rotation that is opposite to that of the second vortex magnetization to generate a high resistance state in said MTJ.

37. The method of claim 34 wherein the MTJ is further comprised of an AFM layer formed adjacent to said reference magnetic layer, said AFM layer pins said second vortex magnetization in a clockwise or counterclockwise rotation.

38. The method of claim 32 wherein the ellipse that determines said elliptically shaped sidewall has a long axis dimension which is said length, a short axis dimension that is said width, and the ratio of said length to said width is less than about 3.

39. The method of claim 32 wherein the ellipse that determines said elliptically shaped sidewall is an asymmetric ellipse formed by combining two half ellipses that have the same long axis and are joined along the long axis and wherein the first half ellipse has a first short axis dimension and the second half ellipse has a second short axis dimension that is less than the first short axis dimension.

40. The method of claim 39 wherein said asymmetric ellipse has a length along the long axis and a width which is the total of the first and second short axis dimensions and wherein the ratio of length to width is less than about 5.

41. The method of claim 32 wherein the first conductive line and second conductive line are each comprised of an electrical conductive layer and a magnetic cladding layer formed thereon wherein the magnetic cladding layer does not cover a side of the electrical conductive layer that faces said MTJ.

42. The method of claim 32 wherein said free magnetic layer and reference magnetic layer are comprised of one or more of Ni, Fe, and Co, or alloys thereof and a dopant that is one of C, N, B, Zr, Ta, Pt, Nb, or Hf with a concentration of about 1% to 40% by weight.

43. The method of claim 32 wherein said MTJ is part of an array of MTJs that are formed between an array of first conductive lines and an array of second conductive lines in an MRAM structure.

44. A method of switching a vortex magnetization state from a first rotational direction to a second rotational direction in a free magnetic layer of an MTJ, comprising:
(a) providing a substrate on which a first conductive line is formed, a second conductive line is formed above and orthogonal to said first conductive line, and an MTJ is formed therebetween, said MTJ has an elliptically shaped sidewall, top and bottom surfaces, a length and a width, and is comprised of a free magnetic layer that has a vortex magnetization formed in a first rotational direction;
(b) applying a first magnetic field with sufficient magnitude in a first direction along a first axis to break the vortex magnetization and generate a remnant magnetization within the free layer in said first direction;
(c) removing said first magnetic field;
(d) applying a second magnetic field in a second direction opposite to said first direction, said second magnetic field has a magnitude that induces a vortex magnetization in a second rotational direction opposite to said first rotational direction; and
(e) removing said second magnetic field.

45. The method of claim 44 wherein said second magnetic field has a magnitude less than the first magnetic field.

46. The method of claim 44 wherein the MTJ is further comprised of a reference layer that has a vortex magnetization pinned in a second rotational direction by an adjacent AFM layer and a low resistance state is produced in the MTJ after step (e).

47. The method of claim 46 wherein said free layer has an Ms of about 100 to 2000 emu/cc and a thickness between about 10 and 200 Angstroms.

48. The method of claim 44 wherein the MTJ is further comprised of a reference layer that has a vortex magnetization pinned in a first rotational direction by an adjacent AFM layer and a high resistance state is produced in the MTJ after step (e).

49. The method of claim 48 wherein said free layer has an Ms of about 100 to 2000 emu/cc and a thickness between about 10 and 200 Angstroms.

50. The method of claim 47 wherein the first rotational direction is counterclockwise, the second rotational direction is clockwise, the magnitude of the first magnetic field is about +50 to +500 Oersted and the magnitude of the second magnetic field is about −5 to −200 Oersted.

51. The method of claim 49 wherein the first rotational direction is clockwise, the second rotational direction is counterclockwise, the magnitude of the first magnetic field is about −50 to −500 Oersted and the magnitude of the second magnetic field is about +5 to +200 Oersted.

52. The method of claim 44 wherein the MTJ is further comprised of a reference magnetic layer that has a vortex magnetization and said free magnetic layer and reference magnetic layer are comprised of one or more of Ni, Fe, and Co, or alloys thereof and a dopant that is one of C, N, B, Zr, Ta, Pt, Nb, or Hf with a concentration of about 1% to 40% by weight.

53. The method of claim 44 wherein the first magnetic field is applied for a period of about 1 to 100 nanoseconds and the second magnetic field is applied for a period of about 1 to 100 nanoseconds.

54. The method of claim 44 wherein removing said first magnetic field comprises a period of 0 to about 10 nanoseconds where there is no magnetic field.

* * * * *